(12) United States Patent
Chiang et al.

(10) Patent No.: US 10,329,681 B2
(45) Date of Patent: Jun. 25, 2019

(54) COPPER-SILVER DUAL-COMPONENT METAL ELECTROPLATING SOLUTION AND ELECTROPLATING METHOD FOR SEMICONDUCTOR WIRE

(71) Applicant: NATIONAL CHUNG SHAN INSTITUTE OF SCIENCE AND TECHNOLOGY, Taoyuan (TW)

(72) Inventors: Chi-Haw Chiang, Taoyuan (TW);
Liang-Huei Jiang, Taoyuan (TW);
Ren-Ruey Fang, Taoyuan (TW);
Chien-Liang Chang, Taoyuan (TW);
Yu-Ping Wang, Taoyuan (TW);
Ming-Ta Hsieh, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 37 days.

(21) Appl. No.: 15/801,496

(22) Filed: Nov. 2, 2017

(65) Prior Publication Data
US 2019/0127871 A1    May 2, 2019

(51) Int. Cl.
*C25D 3/58* (2006.01)
*C25D 3/64* (2006.01)
*H01L 21/768* (2006.01)

(52) U.S. Cl.
CPC .......... *C25D 3/58* (2013.01); *H01L 21/76873* (2013.01); *C25D 3/64* (2013.01); *H01L 21/76843* (2013.01)

(58) Field of Classification Search
CPC .................................... C25D 3/58; C25D 3/64
(Continued)

(56) References Cited

U.S. PATENT DOCUMENTS 7,510,639 B2 *   3/2009   Wang ................... C08G 59/184
                                                            106/1.26
7,821,135 B2    10/2010   Ueno
(Continued)

OTHER PUBLICATIONS

S. Strehle—Microstructure of electroplated Cu(Ag) alloy thin films Thin Solid Films 519 (2011) 3522-3529.
(Continued)

*Primary Examiner* — Brian W Cohen
(74) *Attorney, Agent, or Firm* — Schmeiser, Olsen & Watts, LLP

(57) ABSTRACT

A copper-silver dual-component metal electroplating solution includes copper methanesulfonate, silver methanesulfonate, methanesulfonic acid, chlorine ions, and water. An electroplating method for forming a copper-silver dual-component metal by using such an electroplating solution, the steps of which includes (a) contacting the copper-silver dual-component metal electroplating solution with a substrate; (b) applying an operating voltage, the current density of which is controlled to be between 0.1 and 2 ASD in order to carry out electroplating on the substrate. Therefore, the electroplating solution has environmental characteristics, such as less poisoning hazards, through the design of methanesulfonic acid and methanesulfonate electroplating solution. Also, the potential and the current are adjusted during the electroplating in order to obtain a copper-silver dual-component metal plating layer with a specific silver content.

11 Claims, 6 Drawing Sheets

(58) Field of Classification Search
USPC .......................................................... 205/242
See application file for complete search history.

(56) References Cited

U.S. PATENT DOCUMENTS

2013/0256145 A1* 10/2013 Romer .................... C25D 3/60
205/253
2015/0345039 A1* 12/2015 Josell ...................... C25D 3/38
205/96

OTHER PUBLICATIONS

S. Strehle—Electrical properties of electroplated Cu(Ag) thin films Thin Solid Films 517 (2009) 3320-3325.
S. Strehle—Electroplating of Cu(Ag) thin films for interconnect applications—Microelectronic Engineering 87 (2010) 180-186.
Myung Jun Kim—Facile Formation of Cu-Ag Film by Electrodeposition for the Oxidation-Resistive Metal Interconnect—*Journal of the Electrochemical Society*, 159 (4) D253-D259 (2012).
R. Bernasconi—Electrodeposition of supersaturated CuAg alloys in pyrophosphate-iodide electrolytes—ECS Transactions, 58 (32) 53-60 (2014).

* cited by examiner

COPPER-SILVER DUAL-COMPONENT METAL ELECTROPLATING SOLUTION AND ELECTROPLATING METHOD FOR SEMICONDUCTOR WIRE

FIELD OF THE INVENTION

The present invention relates to a dual-component metal electroplating solution and an electroplating method and, more particularly, to a copper-silver dual-component metal electroplating solution and an electroplating method. The invention can be applied to the wire manufacturing of the semiconductor lines, and the copper-silver dual-component metal plating layer helps to suppress the electromigration phenomenon.

BACKGROUND OF THE INVENTION

With the continuing need of pursuing performance improvement in electronic products, such as computer, communications and handheld devices, and in order to cope with the tendency of miniaturization, high-speed and high-capacity in microelectronics products, the interconnects between transistor devices and wafer carrier board are designed to continuously shrink. When the wire size is less than 500 nm, the current density will be as high as 106 Amp/cm$^2$.

In order to cope with the tendency of miniaturization, high-speed and high-capacity in microelectronics products, the interconnection between transistor devices and wafer carrier board is designed to continuously shrink, resulting in a dramatic increase in the current density of the wire (>105 Amp/cm$^2$). However, the high-density current passing through the wire may cause void or hillock generated therebetween, which is analogous to the electromigration phenomenon occurred in the wires that causes short circuit or open circuit and so on. Therefore, the reliability of the wire becomes an important issue. Copper alloy wire is considered to be a potential solution that may solve electromigration of the electronic wire. According to the guidelines for wire selection specified in ITRS (international technology roadmap for semiconductor) in 2007, the specific resistance value is an important indicator, which must be less than 2.2 μΩcm. Compared with the specific resistance value of the wire plated with copper, which is 1.7~1.9 μΩcm, it is necessary to consider the difference between the specific resistance values in selecting copper alloy wire. Because silver has excellent conductive properties, the copper-silver alloy wire is considered to be a potentially appropriate improvement candidate. The copper-silver alloy film has a specific resistance value of about 2.0~3.0 μΩcm, depending on the silver content and the deposition method. Compared with copper metal, the copper-silver alloy has improved mechanical strength and electromigration resistance.

Regarding the researches in copper-silver metal plating solution system and its copper-silver plating layer, the acid formulation plating system using copper silver sulfate, published by S. Strehle et. al. (Thin Solid Film, 519, 3522 (2011)、Thin Solid Films, 517.11, 3320 (2009)、Microelectronic Engineering, 87.2, 180 (2010)), is the first study discussing the effect of copper-silver metal plating in the electromigration aspects of electronic wires. In the foresaid study, the plating solution composed of the aqueous solution of copper sulfate, silver nitrate, and sulfuric acid was used, and the concentration of added silver nitrate (1.5×10$^{-4}$~3×10$^{-3}$ M) and the current density (0.5~3 ASD) were adjusted to control the silver content of the plating layer. Regarding the finished copper-silver plating layer, the thickness was 1 μm and the silver content of the plating layer can be controlled at 0~4 at. %. M. J. Kim et al. employed alkaline cyanide plating solution to carry out the copper-silver metal plating (J. Electrochem. Soc., 159, D253 (2012)), which mainly perform LSV analysis and the development of copper-silver metal plating processes. In addition, Bernasconi et al. published a copper/silver pyrophosphate plating solution (ECS Transactions, 58.32, 53 (2014)), which mainly controlled the silver content of the plating layer by a process current density of 2 to 5 mA/cm$^2$, resulting in silver content of the plating layer between 3-16 at. %. As the current density increased, the silver content of the plating layer decreased. U.S. Pat. No. 7,821,135 used an alkaline plating solution system of pyrophosphoric acid or ethylenediamine. However, the above study didn't mention how the acidic solution in the electroplating process avoids AgCl precipitation to affect the effect of electroplating. In addition, in consideration of the toxic characteristics of the plating solutions, such as copper sulfate and cyanide, and the condition of using photoresist in the wire definition process, it is not easy to proceed with the industrial applications.

Therefore, there exists a need for an innovative copper-silver dual-component metal electroplating solution and electroplating method in the industry. The electroplating solution has environmental protection characteristics, such as less poisoning hazards, and can avoid the precipitation phenomenon that may exist during the plating process in order to prepare the copper-silver dual-component metal material that meets the need of the industry.

SUMMARY OF THE INVENTION

In view of the shortcomings of the above-mentioned known techniques, it is a principal object of the present invention to provide a copper-silver dual-component metal plating solution and electroplating method. Regarding the selection of the plating solution, the methanesulfonic acid and methanesulfonate have environmental protection characteristics, such as biodegradable property and less poisoning hazards. In the aspect of process, copper methanesulfonate is a plating solution containing high concentration of copper ions and can provide the process characteristic of high current density deposition. In addition, this system may still use the additives used in the traditional acid copper sulfate plating solution system.

In order to achieve the above object, according to the solution proposed by the present invention, there is provided a copper-silver dual-component metal plating solution including copper methanesulfonate, silver methanesulfonate, methanesulfonic acid, chlorine ions, and water, and an electroplating method. With the precise control over the potential and current during the electroplating process, a copper-silver dual-component metal plating layer with a specific silver content can be obtained.

The present invention uses a plating solution system mainly composed of methanesulfonic acid and methanesulfonate, and in order to avoid the generation of silver chloride precipitates in the plating solution, the sulfur-containing double bond thiourea compound can be further introduced into the plating solution system to form complexes with silver ions. The thiourea compound is $(R_1R_2N)(R_3R_4N)C{=}S$, wherein $R_1$, $R_2$, $R_3$ and $R_4$ are the same or different, and are each a hydrogen atom or a hydrocarbon having 1 to 6 carbon atoms. The thiourea compound may be selected from the group consisting of thiourea, diethyl thiourea, phenyl thiourea, allyl thiourea and diphenyl thiourea.

In an embodiment of the present invention, the molarity of copper methanesulfonate is between 0.05 and 0.8 M; the molarity of silver methanesulfonate is between 0.1 and 6 mM; the molarity of chlorine ions is between 0.1 and 3 mM; and the molarity of the thiourea compound is 5 to 10 times greater than that of silver methanesulfonate.

In an embodiment of the present invention, the copper-silver dual-component metal electroplating solution may further comprise a surfactant, which may be a polymer compound with a molecular weight between 2,000 and 20,000. The surfactant may be selected from the group consisting of polyethylene glycol and polypropylene glycol. The addition of the surfactant enhances the adsorption at the region of high current end and increases the polarization effect by functioning with the chloride ions, thereby suppressing the deposition of copper ions at the high current end and thus increasing the flatness of the plating layer.

In an embodiment of the present invention, the surfactant may also be a surfactant product used in the current semiconductor line process, which typically contains an accelerator and a suppressor.

The present invention employs the acidic copper/silver methanesulfonate plating solution to carry out the metal plating process. Different from the conventional acidic copper sulfate/silver nitrate or alkaline cyanide system, the situations of silver chloride deposition and use of cyanide may be avoided to facilitate the application to the semiconductor wire process.

The present invention further provides an electroplating method of a copper-silver dual-component metal. The method includes the steps of: (a) contacting the copper-silver dual-component metal electroplating solution described above with a substrate; and (b) applying an operating voltage, the current density of which is controlled to be between 0.1 and 2 ASD (current density, $A/dm^2$) in order to carry out electroplating on the substrate.

In an embodiment of the present invention, the substrate may be a plate, a wire, a recess portion or a protruding portion. The material of the substrate may be a metal substrate, a glass substrate, a ceramic substrate, or a polymer substrate.

The present invention further provides a copper-silver dual-component metal plating layer prepared by the copper-silver dual-component metal electroplating method described above, in which the silver content of the copper-silver dual-component metal plating layer is between 0.1 and 40 wt %.

The present invention discloses a copper-silver dual-component metal plating solution and electroplating method, characterized in that chloride ions are allowed to exist at a concentration of 0 to 100 ppm through the acidic copper methanesulfonate electroplating solution system. Taking into account the use of photoresist in the semiconductor line definition process, the electroplating solution system of the present invention has a better tolerance than the alkaline electroplating solution system. In addition, the electroplating solution of the present invention has lower toxicity and other environmentally friendly characteristics. By introducing the sulfur-containing double bond thiourea compound, the precipitation phenomenon that may exist during the plating process can be avoided. In terms of the electroplating process, performing the manufacture of a thin film in an electroplating system with precisely controlled voltage/current, the silver content in the copper-silver dual-component metal plating layer can be controlled. The silver content in the obtained copper-silver dual-component metal plating layer may range from 0.1 to 40 wt %. The present invention can be applied to the wire manufacturing of semiconductor lines, and the copper-silver dual-component metal plating layer helps to suppress the electromigration phenomenon.

The foregoing summary and the following detailed description and drawings are intended to further illustrate the manner, means and efficacy employed by the present invention to achieve the intended objects. Other objects and advantages relating to the present invention will be set forth in the following description and the drawings.

DETAILED DESCRIPTION OF THE PREFERRED EMBODIMENTS

Hereinafter, the manner of implementing the present invention will be illustrated by specific embodiments, and the advantages and effects of the present invention will be readily understood by those skilled in the art from the disclosure of the specification.

The present invention provides a copper-silver dual-component metal plating solution and an electroplating method, which may be applied to the manufacture of copper-silver dual-component metal wires. The electroplating system using methanesulfonate chemicals proposed by the present invention employs the methanesulfonic acid and methanesulfonates as main components, including copper methanesulfonate, silver methanesulfonate, methanesulfonic acid, chlorine ions, and water. Also, the sulfur-containing double bond thiourea compound can be introduced into the plating solution system to form complexes with silver ions and avoid the precipitation phenomenon that may exist during the plating process. The present invention may further comprise a surfactant, which may be a polymer compound with a molecular weight between 2,000 and 20,000. The surfactant may be selected from the group consisting of polyethylene glycol and polypropylene glycol.

The present invention further provides an electroplating method of a copper-silver dual-component metal. The method includes the steps of: (a) contacting the copper-silver dual-component metal electroplating solution described above with a substrate; and (b) applying an operating voltage, the current density of which is controlled to be between 0.1 and 2 ASD (current density, A/dm$^2$) in order to carry out electroplating on the substrate.

The present invention further provides a copper-silver dual-component metal plating layer prepared by the copper-silver dual-component metal electroplating method described above, in which the silver content of the copper-silver dual-component metal plating layer is between 0.1 and 40 wt %.

Figure 1:
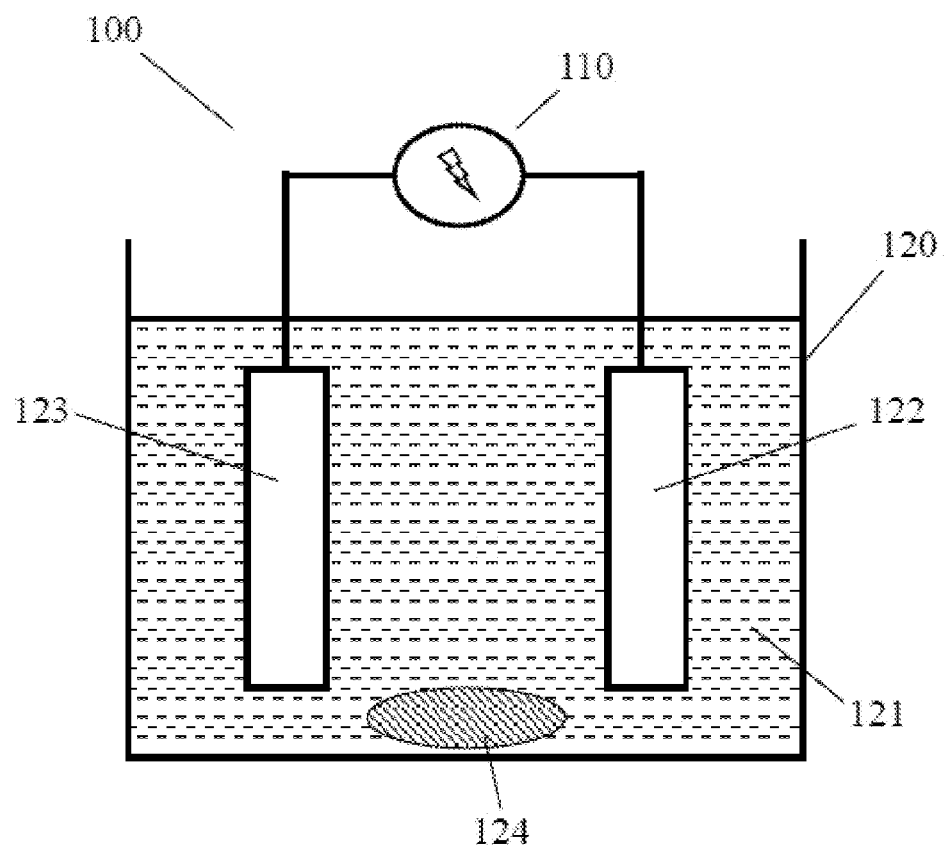
FIG. 1 is a schematic view showing the copper-silver dual-component metal plating according to the present invention.

Refer to FIG. 1, which is a schematic view showing the copper-silver dual-component metal plating according to the present invention. As shown in the figure, the invention utilizes an accurate power supply device and reactor to carry out the electroplating. The power supply 110 has a precisely constant potential and constant current, and electric quantity calculation function. The reactor 120 has a good bath circulation function and a clamping design for fixing electrodes. The electroplating chemical solution 121 uses methanesulfonic acid and methanesulfonate as the main components, with the introduction of thiourea compounds to form complexes with silver ions. By adjusting the concentration of chemicals, such as copper ions, silver ions, sulfur double bond polymer substances and chloride ions, in electroplating chemicals with the precise potential/current control, a copper-silver dual-component metal plating layer having specific silver content can be obtained.

Embodiment: Copper-Silver Dual-Component Metal Plating Layer

In this embodiment, the plating method and the characteristics of the plating layer of the present invention are evaluated by the arrangement of the copper-silver dual-component metal plating solution according to the present invention. The contents of the electroplating solution are 0.63 M of copper methanesulfonate, 0.001 M of silver methanesulfonate, 1.04 M of methanesulfonic acid, 0.01 M of thiourea, 40 ppm of chlorine ions, and 20 ml/L of surfactant (polyethylene glycol), as shown in Table 1, in a capacity of 1 liter. The substrate is a 2×2 cm$^2$ silicon crystal substrate with a 100 nm tantalum nitride barrier layer and a 200 nm copper seed layer on its surface. The substrate was disposed at the cathode of the electroplating system, and a platinum electrode was employed as the anode. The electroplating process employed the constant current control, and the current density was controlled at 1 amp/dm$^2$. The circulation of the plating solution was assisted by stirring (300 rpm). The electroplating procedure was completed by observing the charge accumulation during the electroplating process to 11 coulombs. The thickness of the plating layer of this embodiment was 1 μm.

TABLE 1

| Component | Molecular formula | Content |
|---|---|---|
| Copper methanesulfonate | $Cu(SO_3CH_3)_2$ | 0.63M |
| Silver methanesulfonate | $Ag(SO_3CH_3)$ | 0.001M |
| Methanesulfonic acid | $CH_3SO_3H$ | 1.04M |
| Thiourea | $CH_4N_2S$ | 0.01M |
| Chlorine ions | $Cl^-$ | 40 ppm |
| Surfactant (polyethylene glycol) | PEG | 20 ml/L |

Figure 2:
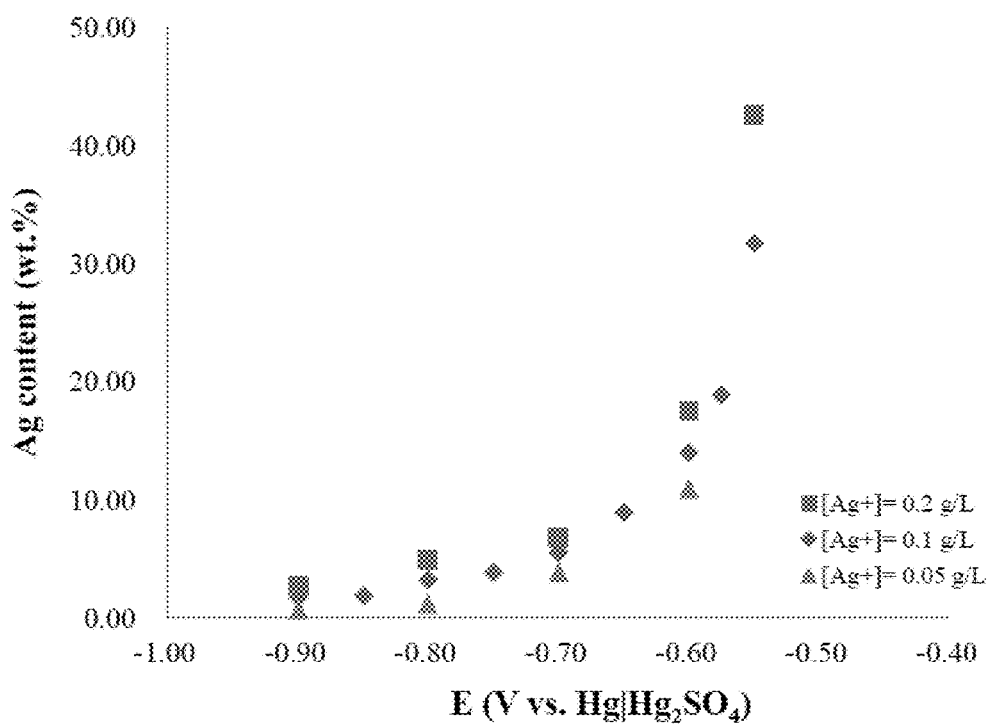
FIG. 2 is a graph showing the relationship between the silver content in the copper-silver dual-component metal plating layer and the potential according to the embodiment of the present invention.

Refer to FIG. 2, which is a graph showing the relationship between the silver content in the copper-silver dual-component metal plating layer and the potential in the embodiment of the present invention. As shown in the figure, with the adjustment of the plating potential, the copper-silver dual-component metal plating layer prepared has a controlled silver content between 0 and 40 wt %, indicating that the present invention can obtain a copper-silver dual-component metal plating layer having a specific silver content by cooperating with an accurate power supply to control the constant potential/constant current.

Figure 3:
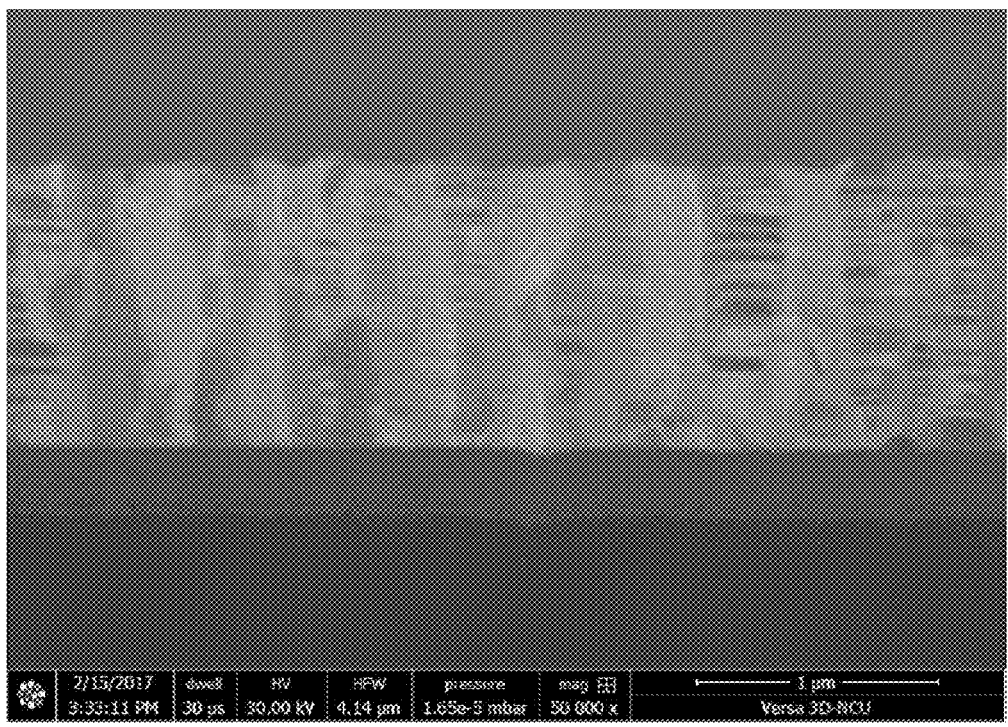
FIG. 3 is a scanning electron microscope image of the copper-silver dual-component metal plating layer according to the embodiment of the present invention.

Refer to FIG. 3, which is a scanning electron microscope image of the copper-silver dual-component metal plating layer according to the embodiment of the present invention. As shown in the figure, the crystal lattice was found to be columnar and have a microstructure of twin-lamella by observing the cross section of the copper-silver dual-component metal plating layer (silver content: 3.25 wt %) of the embodiment through an electron microscope, showing that the present invention can be applied to the wire manufacturing of semiconductor lines. The copper-silver dual-component metal plating layer of the present invention helped to suppress the electromigration phenomenon.

Figure 4:
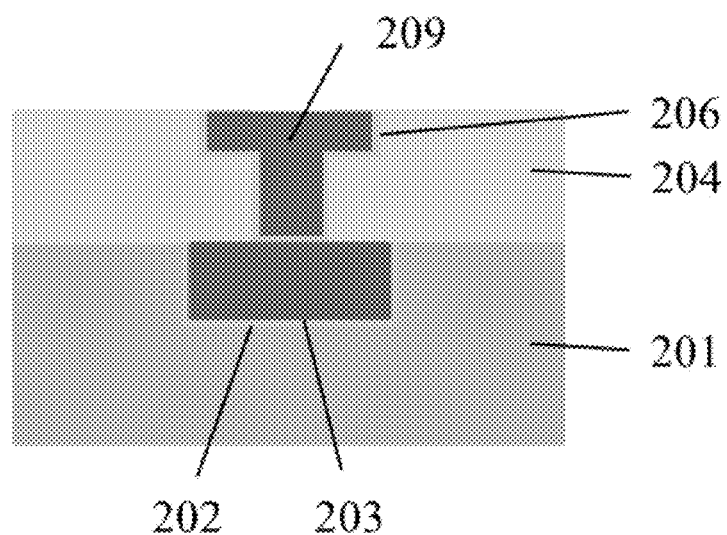
FIG. 4 is a schematic view showing the structure of the copper-silver dual-component metal microelectronic wire of the present invention.
Figure 5A:
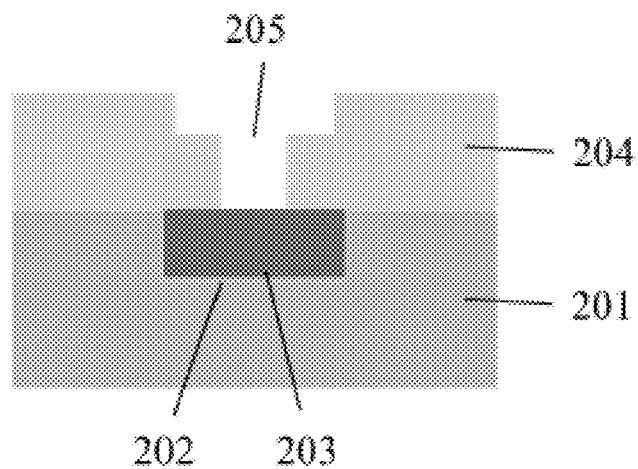
FIG. 5A is a schematic view illustrating the process of the copper-silver dual-component metal microstructure wires of the present invention.
Figure 5B:
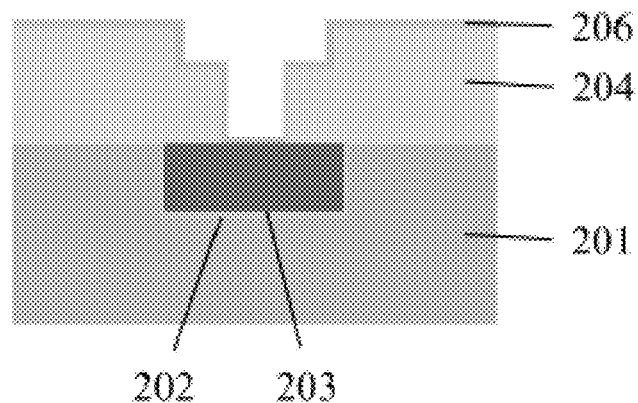
FIG. 5B is a schematic view illustrating the process of the copper-silver dual-component metal microstructure wires of the present invention.
Figure 5C:
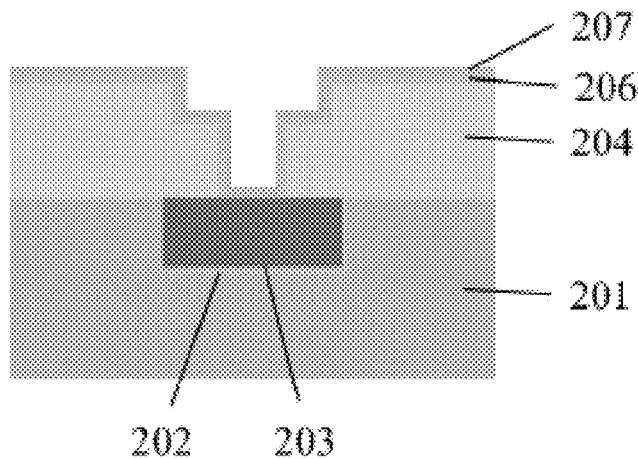
FIG. 5C is a schematic view illustrating the process of the copper-silver dual-component metal microstructure wires of the present invention.
Figure 5D:
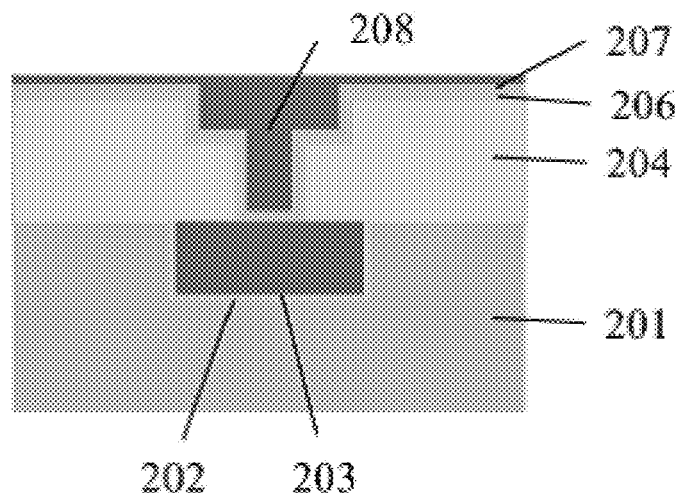
FIG. 5D is a schematic view illustrating the process of the copper-silver dual-component metal microstructure wires of the present invention.
Figure 5E:
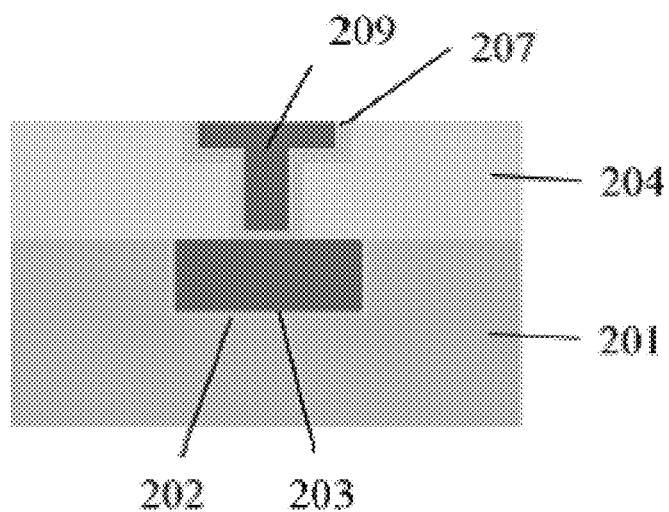
FIG. 5E is a schematic view illustrating the process of the copper-silver dual-component metal microstructure wires of the present invention.

Refer to FIG. 4, which is a schematic view showing the structure of the copper-silver dual-component metal microelectronic wire of the present invention. The wire process is shown in FIGS. 5A to 5E. FIG. 5A is a micro-wire structure (groove or hole), which is formed by providing an insulating substrate 201 (silicon or ceramic) containing a barrier layer 202 and a copper wire or copper/silver bimetallic component wire 203 therein. After the insulating layer 204 is formed above the insulating substrate 201, the wire microstructure 205 is completed by the wire pattern defining and the etching method. FIG. 5B shows the formation of the barrier layer 206 on the wire microstructure. The barrier layer 206 is typically made of high melting point materials, such as titanium, titanium nitride, tungsten, tungsten nitride, tantalum, tantalum nitride by PVD (physical vapor deposition) or CVD (chemical vapor deposition). FIG. 5C shows the growth of the seed layer (207). The preparation of the copper film is usually completed by PVD for use in the following film plating process. FIG. 5D shows the formation of copper film/copper-silver dual-component metal film 208 on the surface of the insulating layer 204 and the microstructure 205 by the application of electroplating process using suitably formulated plating solution of copper silver methanesulfonate and parameter adjustment of electroplating process. FIG. 5E shows that the plating thin film layer is precisely grinded by chemical mechanical polishing (CMP) to complete the manufacture of the microstructure wire 209.

As shown in FIG. 5D, the plated thin film layer can be applied to the microstructure wire process. The electroplated copper/silver wire is fabricated on the microstructure surface 205 of the insulating layer 201 or the insulating layer 204 by formulating the suitable plating solution of copper silver methanesulfonate and adjusting the parameters of the electroplating process. The electroplated copper/silver wire has excellent electromigration resistance to improve the reliability of the wire.

In the copper-silver dual-component metal electroplating solution and electroplating method according to the present invention, through the design of methanesulfonic acid and methanesulfonate electroplating solution, the electroplating solution can have low toxicity and other environmentally friendly characteristics. By introducing the thiourea compounds into the electroplating solution, the precipitation phenomenon that may exist during the plating process can be avoided. With the adjustment of the potential (current) during plating, the copper-silver dual-component metal plating layer thus prepared can have a controlled silver content between 0.1 and 40 wt %, indicating that the copper-silver dual-component metal electroplating solution and electroplating method of the present invention can obtain a copper-silver dual-component metal plating layer having a specific silver content by cooperating with an accurate power supply to control the constant potential/constant current. The crystal lattice of the copper-silver dual-component metal plating layer exhibits a pillar shape and has a twin-lamella microstructure, showing that the copper-silver dual-component metal electroplating solution and electroplating method of the present invention can be applied to the wire manufacturing of semiconductor lines to help suppress the electromigration phenomenon and broaden its application field in the future.

The embodiments described above are merely exemplary illustration of the features and effects of the present invention and are not intended to limit the scope of the substantial technical contents of the present invention. Any person skilled in the art may modify and alter the foresaid embodiments without departing from the spirit and scope of the invention. Accordingly, the scope of the present invention should be determined by the appended claims.

What is claimed is:

1. A copper-silver dual-component metal electroplating solution, including copper methanesulfonate, silver methanesulfonate, methanesulfonic acid, chlorine ions, a thiourea compound and water
   wherein the molarity of chlorine ions is between 0.1 and 3 mM;
   the thiourea compound, which is $(R_1R_2N)(R_3R_4N)C=S$, wherein $R_1$, $R_2$, $R_3$ and $R_4$ are the same or different, and are each a hydrogen atom or a hydrocarbon;
   and wherein the molarity of the thiourea compound is 5 to 10 times greater than that of silver methanesulfonate.

2. The copper-silver dual-component metal electroplating solution of claim 1, wherein the molarity of copper methanesulfonate is between 0.05 and 0.8 M.

3. The copper-silver dual-component metal electroplating solution of claim 1, wherein the molarity of silver methanesulfonate is between 0.1 and 6 mM.

4. The copper-silver dual-component metal electroplating solution of claim 1, wherein the thiourea compound is selected from the group consisting of thiourea, diethyl thiourea, phenyl thiourea, allyl thiourea and diphenyl thiourea.

5. The copper-silver dual-component metal electroplating solution of claim 1, further comprising a surfactant.

6. The copper-silver dual-component metal electroplating solution of claim 4, further comprising a surfactant.

7. The copper-silver dual-component metal electroplating solution of claim 5, wherein the surfactant is a polymer compound with a molecular weight between 2,000 and 20,000.

8. The copper-silver dual-component metal electroplating solution of claim 6, wherein the surfactant is a polymer compound with a molecular weight between 2,000 and 20,000.

9. The copper-silver dual-component metal electroplating solution of claim 5, wherein the surfactant is selected from the group consisting of polyethylene glycol and polypropylene glycol.

10. The copper-silver dual-component metal electroplating solution of claim 6, wherein the surfactant is selected from the group consisting of polyethylene glycol and polypropylene glycol.

11. An electroplating method of a copper-silver dual-component metal, including the steps of:
    (a) contacting the copper-silver dual-component metal electroplating solution of claim 1 with a substrate;
    (b) applying an operating voltage, the current density of which is controlled to be between 0.1 and 2 ASD in order to carry out electroplating on the substrate.

* * * * *